(12) United States Patent
Kim et al.

(10) Patent No.: US 8,053,673 B2
(45) Date of Patent: Nov. 8, 2011

(54) CAPACITOR EMBEDDED PRINTED CIRCUIT BOARD

(75) Inventors: Jin Cheol Kim, Gyunggi-do (KR); Tae Kyoung Kim, Gyunggi-do (KR); Jun Rok Oh, Seoul (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 496 days.

(21) Appl. No.: 12/068,790

(22) Filed: Feb. 12, 2008

(65) Prior Publication Data

US 2008/0223603 A1    Sep. 18, 2008

(30) Foreign Application Priority Data

Mar. 12, 2007  (KR) .................. 10-2007-0024071

(51) Int. Cl.
*H05K 1/00* (2006.01)
(52) U.S. Cl. ........................................ 174/250
(58) Field of Classification Search .............. 174/255, 174/250, 260, 261; 361/761–764, 784, 785, 361/813
See application file for complete search history.

(56) References Cited

U.S. PATENT DOCUMENTS

| | | | |
|---|---|---|---|
| 6,813,138 B1* | 11/2004 | Jow et al. | 361/306.1 |
| 7,316,755 B2 | 1/2008 | Ito et al. | |
| 2006/0032666 A1* | 2/2006 | Kim et al. | 174/255 |
| 2006/0139849 A1* | 6/2006 | Yoon et al. | 361/306.3 |
| 2008/0239685 A1* | 10/2008 | Kawabe et al. | 361/782 |
| 2008/0273288 A1* | 11/2008 | Horowitz et al. | 361/303 |
| 2009/0255719 A1* | 10/2009 | Yamamoto et al. | 174/260 |

FOREIGN PATENT DOCUMENTS

| | | |
|---|---|---|
| JP | 2006-060187 | 3/2006 |
| JP | 2006-278759 | 10/2006 |
| KR | 10-2005-0031400 | 4/2005 |
| KR | 10-2006-0016058 | 2/2006 |

OTHER PUBLICATIONS

Korean Office Action with English Translation issued in Korean Patent Application No. 10-2007-0024071, dated Feb. 11, 2008.
Japanese Office Action, with English Translation, issued in Japanese Patent Application No. 2008-038803, dated Apr. 13, 2010.

* cited by examiner

*Primary Examiner* — Yuriy Semenenko
(74) *Attorney, Agent, or Firm* — McDermott Will & Emery LLP

(57) ABSTRACT

A capacitor embedded printed circuit board (PCB) includes a multilayer polymer capacitor layer with a plurality of polymer sheets. One or more first inner electrodes and second inner electrodes, separated by one or more of the plurality of polymer sheets, are alternately disposed to form a pair. A plurality of first extended electrodes and second extended electrodes protrude from the first inner electrodes and second inner electrodes, respectively. One or more insulating layers are laminated on one or both surfaces of the multilayer polymer capacitor. A plurality of first via holes for capacitor, and a plurality of second via holes for capacitor, penetrating the multilayer polymer capacitor layer are connected to the first extended electrodes and the second extended electrodes, respectively. The plurality of the first and second extended electrodes are alternately disposed to be opposite to each other.

9 Claims, 6 Drawing Sheets

CAPACITOR EMBEDDED PRINTED CIRCUIT BOARD

CROSS-REFERENCE TO RELATED APPLICATIONS

This application claims the priority of Korean Patent Application No. 2007-0024071 filed on Mar. 12, 2007, in the Korean Intellectual Property Office, the disclosure of which is incorporated herein by reference.

BACKGROUND OF THE INVENTION

1. Field of the Invention

The present invention relates to a capacitor embedded printed circuit board (PCB), and more particularly, to a capacitor embedded PCB, capable of decreasing an inductance by controlling an electrode structure of the embedded capacitor and of easily embodying high capacitance for unit area by controlling a number of multilayers and an area of electrodes.

2. Description of the Related Art

In general, a capacitor is a device storing energy as the form of charges and has properties, in which charges are stored and a current does not flows in the case of a direct current (DC) power source and a current flows in proportion to a change in voltage according to a capacitance of the capacitor and time while the capacitor is charged/discharged in the case of an alternating current (AC).

Due to such properties, capacitors are essential passive devices used for coupling and decoupling, filtering, impedance matching, charge pumping, and demodulation in such as digital circuits, analog circuits, and electric electronic circuits such as high frequency circuits and generally manufactured in various forms such as chips and disks and mounted on a surface on a PCB to be used.

However, as electronic devices become miniaturized and complicated, an area for mounting passive elements on a PCB is reduced. Also, as speed of electronic devices becomes high, frequency is increased. Thereupon, parasitic impedances occurring due to various causes such as a conductor or solder between passive devices and an integrated chip (IC) cause various problems. To solve problems, various attempts to embed a capacitor in a PCB are made.

Up to now, on a surface of general PCBs, a general discrete chip resistor or a general discrete chip capacitor is mounted. However, recently, PCBs with a passive device such as a resistor or capacitor, embedded therein, have been developed.

Passive device embedded PCB technology indicates that a passive device such as a resistor or capacitor is inserted into an inner layer of a board by using new materials and processes and replaces a conventional chip resistor or chip capacitor. That is, a PCB with a passive device embedded therein has the passive device, for example, a capacitor embedded in an inner layer or the outside of the board itself. Regardless of a size of the board, when the capacitor that is a passive device is integrated into the PCB as a part, the capacitor is called as an "embedded capacitor" and the PCB is called as an "capacitor embedded PCB". Most important feature of the capacitor embedded PCB is that there is no need to mount a capacitor on a surface of a PCB since the capacitor is provided as a part of the PCB.

To manufacture a wireless terminal miniaturized while having various functions, it is required to use a higher RF bandwidth. According to this, self resonance frequency of a passive device is required to be higher. Also, in the case of a decoupling capacitor used for power source stabilization, it is required to reduce impedance at high frequency.

FIG. 1 is a cross-sectional view illustrating a conventional capacitor embedded PCB.

Referring to FIG. 1, a capacitor includes inner electrodes 14 and 17 and a dielectric layer 11 interposed between the inner electrodes 14 and 17. The inner electrodes 14 and 17 are connected to positive and negative electrodes via via holes 16 and 19, respectively. In the capacitor embedded PCB, directions of currents passing through an anode and cathode of the capacitor embedded in the PCB are allowed to be opposite to each other to compensate parasitic inductance occurring due to the current, thereby reducing entire parasitic inductance.

However, in the case of PCB where a conventional capacitor is embedded, it is advantageous to reduce inductance but a capacitance value thereof is too small to be actually used.

SUMMARY OF THE INVENTION

An aspect of the present invention provides a capacitor embedded printed circuit board (PCB) capable of having a higher capacitance per unit area than a conventional capacitor embedded PCB and reducing high inductance of a multi-layer ceramic capacitor (MLCC) mounted on a surface by an electrode structure of a multilayer capacitor.

According to an aspect of the present invention, there is provided a capacitor embedded PCB including: a multilayer polymer capacitor layer where a plurality of polymer sheets is laminated; one or more first inner electrodes and second inner electrodes, separated by one or more of the plurality of polymer sheets and alternately disposed to form a pair; a plurality of first extended electrodes and second extended electrodes connected to the first inner electrodes and second inner electrodes, respectively; one or more insulating layers laminated on one or both surfaces of the multilayer polymer capacitor, where a plurality of conductive patterns and conductive via holes, forming an interlayer circuit, are formed; a plurality of first via holes for capacitor, penetrating the multilayer polymer capacitor layer to be connected to the first extended electrodes; and a plurality of second via holes for capacitor, penetrating the multilayer polymer capacitor layer to be connected to the second extended electrodes, wherein the plurality of the first and second extended electrodes are alternately disposed to be opposite to each other.

In this case, the plurality of the first and second inner electrodes may be formed interposing one of more of the polymer sheets, and the plurality of the first and second inner electrodes may have a different area from each other.

The first and second inner electrodes may be formed in a rectangular shape. In this case, the first and second extended electrodes may be formed on two long side surface opposite to the first and second inner electrodes, respectively. The first and second extended electrodes formed on the same long side surface may have the same interval.

According to another aspect of the present invention, there is provided a capacitor embedded PCB including: a multilayer polymer capacitor layer where a plurality of polymer sheets is laminated; one or more first inner electrodes and second inner electrodes, separated by one or more of the plurality of polymer sheets and alternately disposed to form a pair; a plurality of first extended electrodes and second extended electrodes connected to the first inner electrodes and second inner electrodes, respectively; one or more insulating layers laminated on one or both surfaces of the multilayer polymer capacitor, where a plurality of conductive patterns and conductive via holes, forming an interlayer circuit, are formed; a plurality of first via holes for capacitor, penetrating the multilayer polymer capacitor layer to be connected to the first extended electrodes; and a plurality of second via holes for capacitor, penetrating the multilayer polymer capacitor layer to be connected to the second extended electrodes, wherein the first and second inner electrodes are formed in a circular shape, and the plurality of the first and second extended electrodes are alternately disposed to be opposite to each other.

The first and second extended electrodes adjacent to each other may be formed to have the same interval. In this case, a number of the plurality of the first and second extended electrodes may be an odd number or an even number, respectively.

In this case, the plurality of the first and second inner electrodes may be formed interposing one of more of the polymer sheets, and the plurality of the first and second inner electrodes may have a different area from each other.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
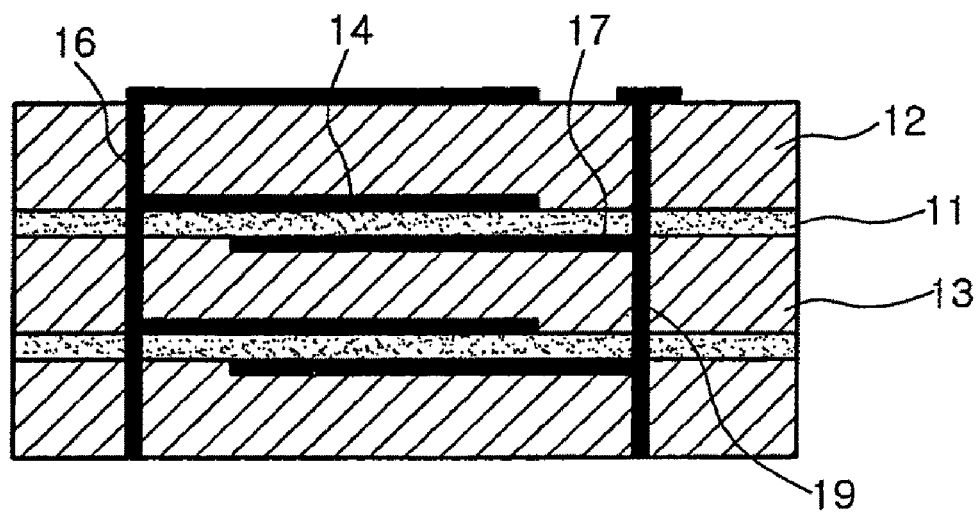
FIG. 1 is a cross-sectional view illustrating a conventional embedded capacitor printed circuit board (PCB)
Figure 2:
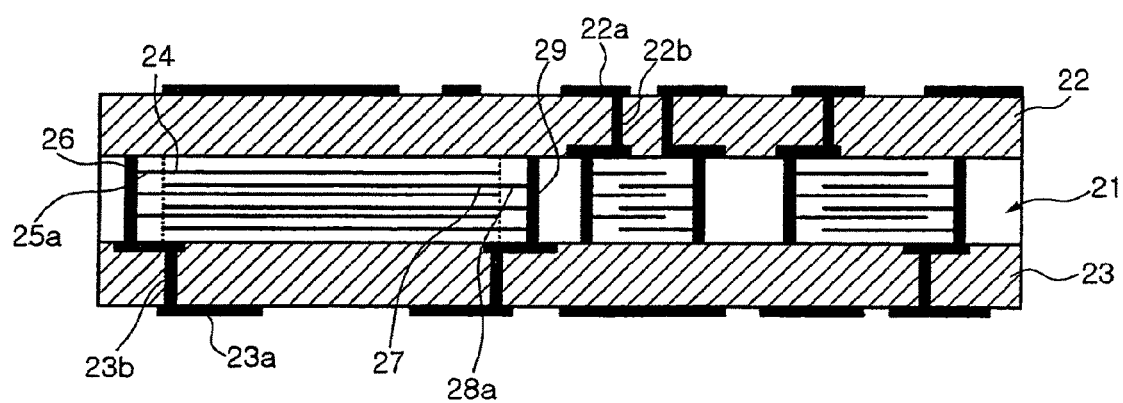
FIG. 2 is a cross-sectional view illustrating a capacitor embedded PCB according to an embodiment of the present invention.

FIG. 2 is a cross-sectional view illustrating a capacitor embedded printed circuit board (PCB) according to an embodiment of the present invention.

Referring to FIG. 2, the PCB includes a multilayer polymer capacitor layer 21 where inner electrodes are formed and insulating layers 22 and 23.

The multilayer polymer capacitor layer 21 is formed of a plurality of laminated polymer sheets, and the multilayer polymer capacitor layer 21 is formed by laminating one or more of the plurality of polymer sheets where a first inner electrode 24 of conductivity is patterned on one surface thereof and a second inner electrode 27 forming a pair together with the first inner electrode is patterned.

The first inner electrode 24 is connected to a first via hole 26 for capacitor via a first extended electrode 25a, and the second inner electrode 27 is connected to a second via hole 29 via a second extended electrode 28a. Though there are shown one first via hole for capacitor and one second via hole in FIG. 2, a plurality of extended electrodes may be formed in an electrode of the multilayer polymer capacitor and a via hole for capacitor may be connected to for each of the plurality of extended electrodes.

The first inner electrode 24 and the second inner electrode 27 formed in the multilayer polymer capacitor layer 21, connected to outer electrodes via the first and second via holes 26 and 29, respectively, have mutually different polarities. Accordingly, the capacitor formed of the first inner electrode 24 and the second inner electrode 27 is in the shape obtained by folding a capacitor panel.

Generally, a capacitance varies with an area and a thickness of a capacitor and is calculated as following equation.

$$C = \varepsilon_r \varepsilon_0 \left(\frac{A}{D}\right) \quad \text{Equation (1)}$$

wherein $\varepsilon_r$ indicates a dielectric constant of a dielectric, $\varepsilon_0$ indicates a constant having $8.855 \times 10^{-8}$, A indicates a surface area of the dielectric, and D indicates a thickness of the dielectric. That is, to embody a capacitor with high capacitance, the dielectric constant of the dielectric should be high, the thickness of the dielectric should be small, and the surface area should be wide. When a number of laminated polymer capacitor layers is great, the surface area becomes broader, thereby increasing a capacitance. When the number of the polymer capacitor layers is small, the capacitance becomes small. Accordingly, in the present embodiment, a capacitance of a capacitor embedded in a PCB may be controlled by controlling a number of laminated polymer capacitor layers, thereby embodying a capacitor with high capacitance.

The insulating layers 22 and 23 are formed on a top and bottom of the multilayer polymer capacitor layers 21, respectively.

The insulating layers 22 and 23 may be obtained by laminating copper foil on both surface of a supplementary member such as flame retardant (FR)-4, forming via holes 22b and 23b on predetermined positions using laser drilling or mechanical drilling, and filling the via holes 22b and 23b, exposing light and developing by coating a dry film on the both surfaces of the supplementary member, and forming circuit patterns 22a and 23a by etching the copper foil.

As a method of forming the circuit patterns 22a and 23a, various methods of appropriately mixing etching and plating may be used. Also, as the insulating layer, a board with a supplementary member formed of appropriate materials in addition to FR-4 according to a purpose of a PCB may be used.

Since capacitors having various values may be embodied in the multilayer polymer capacitor layer 21, it is possible to very freely design.

That is, a capacitance of a capacitor is in proportion to an area of inner electrodes of the capacitor as shown in Equation 1. Since the multilayer polymer capacitor 21 is in the shape obtained by folding a capacitor panel, when increasing a number of laminated polymer capacitor layers, as a result, it is equal to increase an area of inner electrodes of the panel capacitor, thereby increasing the capacitance value.

Accordingly, a capacitor with a high capacitance may be embodied by forming a large number of inner electrodes in a part requiring a high capacitance and a capacitor with a low capacitance may be embodied by forming a small number of inner electrodes in a part requiring a low capacitance.

Also, a capacitance value may be controlled by controlling an area of inner electrodes formed in a multilayer polymer capacitor layer. That is, an area of inner electrodes is designed to be large in a part requiring a capacitor with a high capacitance and an area of inner electrodes is designed to be small in a part requiring a capacitor with a low capacitance, thereby freely design a capacitor with a desirable capacitance in a multilayer polymer capacitor having limited thickness and area.

Figure 3:
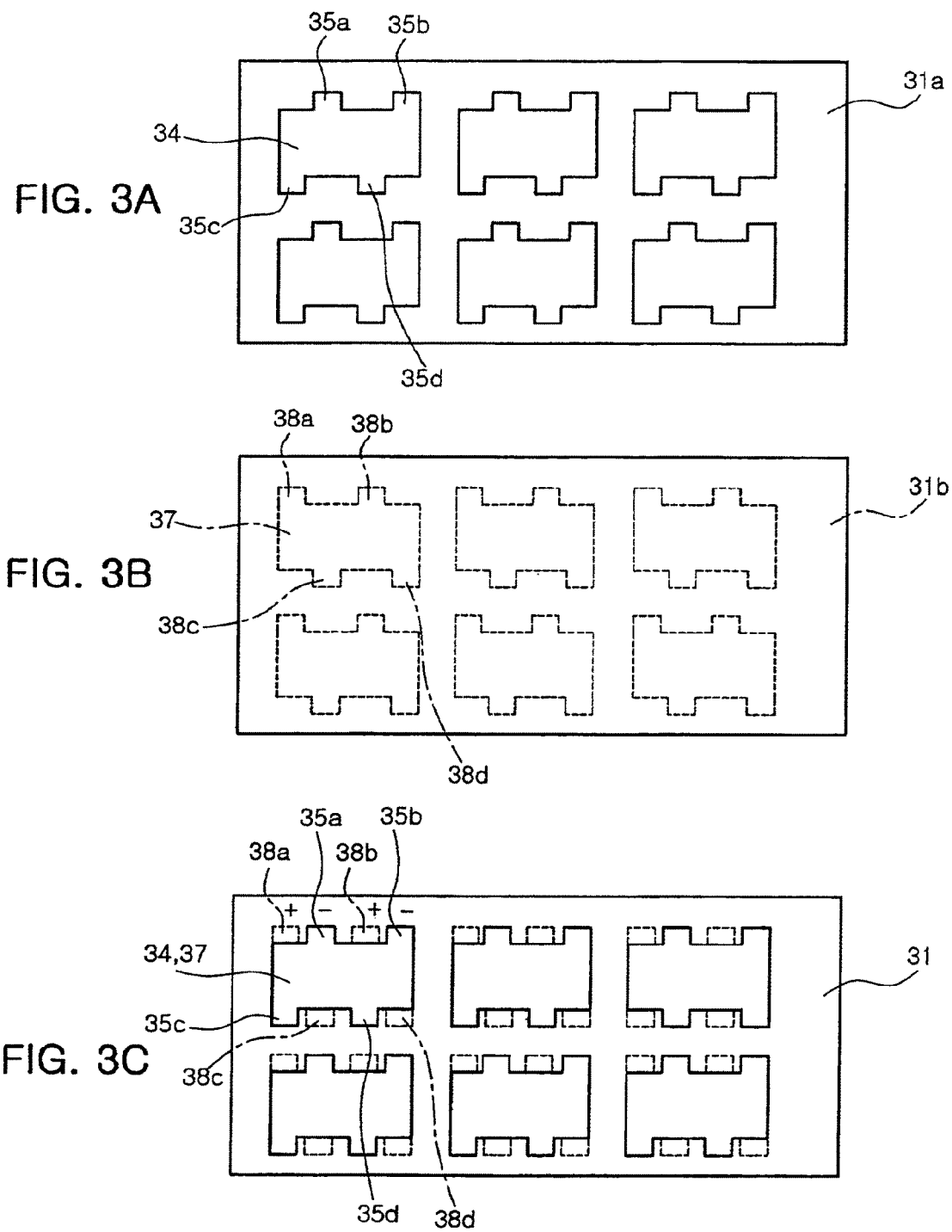
FIGS. 3A to 3C are top views illustrating a polymer sheet where a plurality of first inner electrodes are formed, a polymer sheet where a plurality of second inner electrodes are formed, and a lamination of polymer sheets where the plurality of first and second inner electrodes are formed, according to an embodiment of the present invention.

FIGS. 3A to 3C are top views illustrating a polymer sheet 31a where a plurality of first inner electrodes 34 are formed, a polymer sheet 31b where a plurality of second inner electrodes 37 are formed, and a lamination of polymer sheets where the plurality of first and second inner electrodes are formed, according to an embodiment of the present invention.

Referring to FIG. 3A, the plurality of first inner electrodes 34 are formed on the polymer sheet 31a. In the present embodiment, six first inner electrodes 34 having the same area are formed. However, the number and the area of the first inner electrode may vary with a desired capacitance value.

Each of the plurality of first inner electrodes 34 is formed to have a predetermined area, and a plurality of first extended electrodes 35a to 35d are formed from the first inner electrode 34.

The first extended electrodes 35a to 35d are formed on one surface of the first inner electrode 34 and another surface opposite thereto. The first extended electrodes 35a to 35d connect the first inner electrode 34 to first via holes for capacitors (not shown).

In the present embodiment, two extended electrodes 35a and 35b are formed on one surface of the first inner electrode 34 and two extended electrodes 35c and 35d are formed on another surface opposite to the one surface. The extended electrodes may be formed on the respective surfaces of the first inner electrode 34.

Referring to FIG. 3B, the plurality of second inner electrodes 37 are formed on the polymer sheet 31b. In the present embodiment, six second inner electrodes 37 having the same area are formed. However, the number and area of the second inner electrodes may vary with a desired capacitance value.

The second inner electrodes 37 and the first inner electrodes 34 form pairs, interposing one polymer sheet therebetween. Also, a capacitance is determined by an area of each inner electrode. Accordingly, the second inner electrodes 37 may be formed to have a size corresponding to the inner electrodes 34.

The second inner electrode 37 is formed to have a predetermined area, and a plurality of second extended electrodes 38a to 38d are extended from the second inner electrode 37.

The second extended electrodes 38a to 38d are formed on one surface of the second inner electrode 37 and another surface opposite thereto. The second extended electrodes 38a to 38d connect the second inner electrode 37 to second via holes for capacitors (not shown).

In the present embodiment, two extended electrodes 38a and 38b are formed on one surface of the second inner electrode 37 and two extended electrodes 38c and 38d are formed on another surface opposite to the one surface. The extended electrodes may be formed on the respective surfaces of the second inner electrode 37.

FIG. 3C is a top view illustrating a lamination of the polymer sheets 31a and 31b of FIGS. 3A and 3B.

Referring to FIG. 3C, the first inner electrode 34 and the second inner electrode 37 form a pair, interposing one polymer sheet therebetween, and have the same area, respectively.

A capacitance occurs between the first inner electrode 34 and the second inner electrode 37 formed interposing the polymer sheet.

The first extended electrodes 35a to 35d extended from the first inner electrode 34 and the second extended electrodes 38a to 38d extended from the second inner electrode 37 are alternately formed with a predetermined interval B, not to overlap others.

In the present embodiment, a negative electrode is connected to the first extended electrodes 35a to 35d and a positive electrode is connected to the second extended electrodes 38a to 38d. The first extended electrodes 35a to 35d and the second extended electrodes 38a to 38d are alternately disposed as described above, thereby forming a structure where the positive and negative electrodes are alternately disposed.

A current flows from a positive electrode to a negative electrode. In the present embodiment, a current flows from the second extended electrodes 38a to 38d from the first extended electrodes 35a to 35d and magnetic flux caused by a current is set off in the center of the inner electrodes 34 and 37. Accordingly, the magnetic flux is hardly generated. This will be described in detail with reference to FIG. 4.

Figure 4:
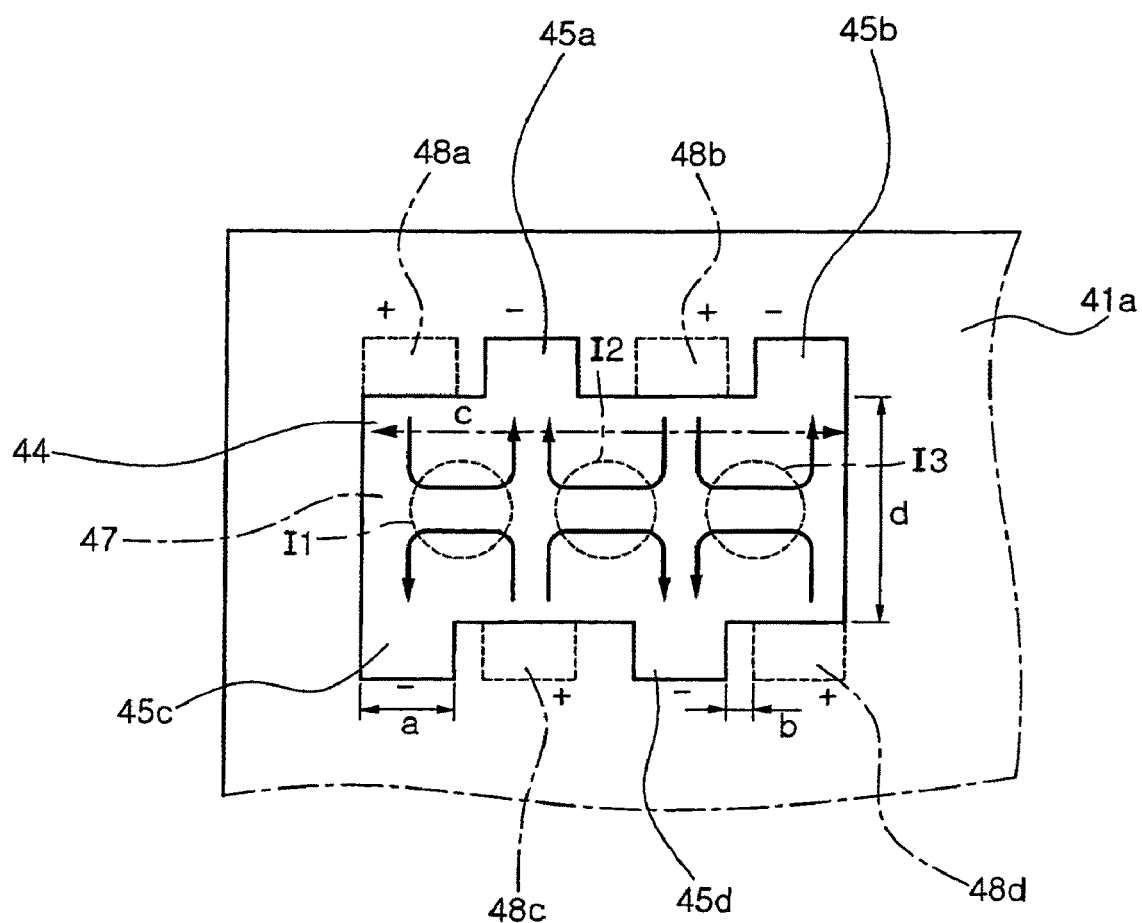
FIG. 4 is a top view illustrating a path of a current flowing through the inner electrodes of FIG. 3C.

FIG. 4 is a top view illustrating a current path (a direction of an arrow) in inner electrodes laminated to form a multilayer polymer capacitor layer.

A first inner electrode 44 and a second inner electrode 47 having a different polarity from each other are disposed to be opposite to each other, interposing a polymer sheet 41a. A pair of the two inner electrodes 44 and 47 is repeatedly laminated in the multilayer polymer capacitor layer.

Among first extended electrodes 45a to 45d and second extended electrodes 48a to 48d connected to the first and second inner electrodes 44 and 47, extended electrodes formed in the same direction are formed to be separated at the same interval b.

Referring to FIG. 4, the first inner electrode 44 formed on the polymer sheet 41a is electrically connected to a negative electrode via a plurality of the first extended electrodes 45a to 45d and conductive via holes (not shown). Also, the second inner electrode 47 formed on another polymer sheet is electrically connected to a positive electrode via a plurality of the second extended electrodes 48a to 48d and conductive via holes (not shown).

Due to a feature that a current flowing through an inner electrode flows via a shortest path, the current flows from a positive extended electrode to a most adjacent negative extended electrode. That is, the current path is formed from the respective second extended electrodes 48a, 48b, 48c, and 48d to the respective first extended electrodes 45a, 45b, 45c, and 45d. Only, the arrow indicating a direction of the current in FIG. 4 just indicates a direction that the current generally flows. Strictly, the current flows from all of positive terminals to all of negative terminals.

Accordingly, magnetic fluxes are effectively set off due to currents flow in a different direction from each other in internal regions $I_1$, $I_2$, and $I_3$ of the first and second inner electrodes. Accordingly, in the multilayer polymer capacitor layer, mutual inductance due to the currents flowing in a direction opposite to each other may be easily removed or set off, thereby more decreasing ESL of a capacitor. In an aspect of setting off the magnetic fluxes in the multilayer polymer capacitor, that is, in an aspect of ESL, it is advantageous that a width d of an inner electrode is smaller than a length c thereof.

As described above, to effectively set off the magnetic fluxes flowing through the inner electrode, it is required to form the positive extended electrode and the negative extended electrode to be opposite to each other and alternately disposed with the same interval.

Figure 5A:
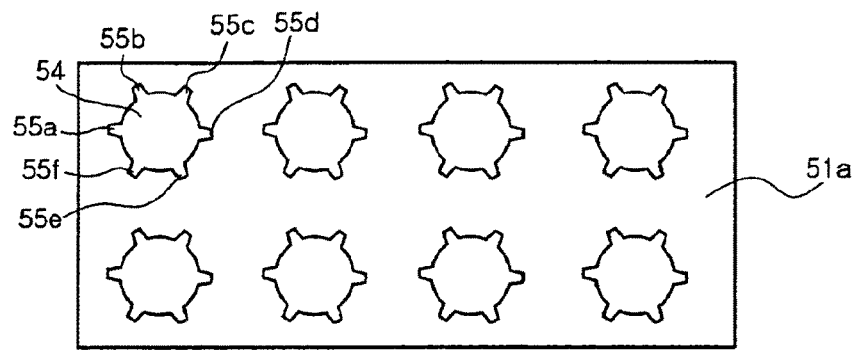
FIGS. 5A to 5C are top views illustrating a polymer sheet where a plurality of first inner electrodes are formed, a polymer sheet where a plurality of second inner electrodes are formed, and a lamination of polymer sheets where the plurality of first and second inner electrodes are formed, according to an embodiment of the present invention.
Figure 5B:
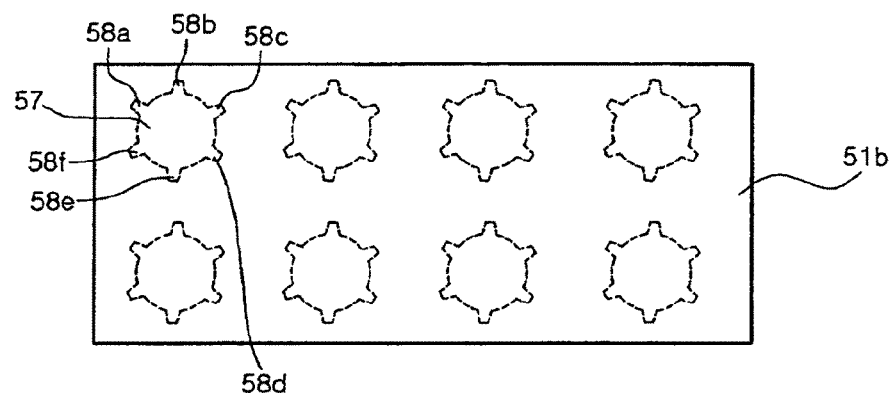
Figure 5C:
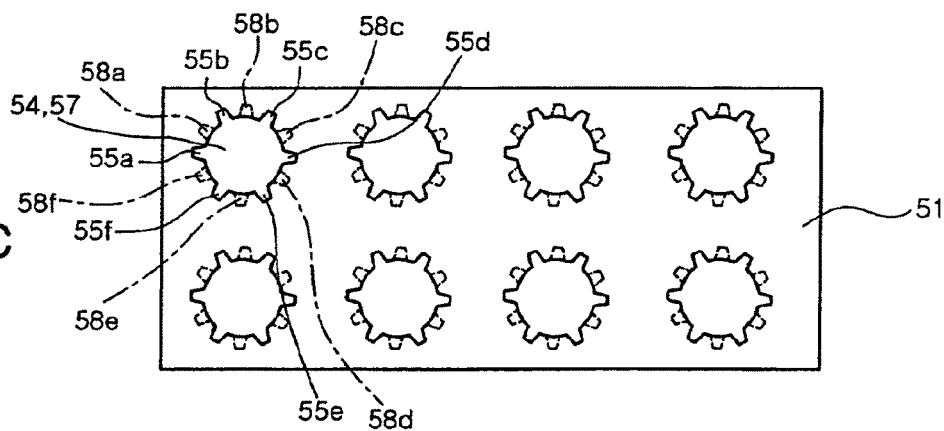

FIGS. 5A to 5C are top views illustrating a polymer sheet 51a where a plurality of first inner electrodes 54 are formed, a polymer sheet 51b where a plurality of second inner electrodes 57 are formed, and a lamination of the polymer sheets 51a and 51b where the plurality of first and second inner electrodes 54 and 57 are formed, according to an embodiment of the present invention.

Referring to FIG. 5A, a plurality of the first inner electrodes 54 are formed on the polymer sheet 51a. In the present embodiment, six first inner electrodes 54 having the same area are formed. However, the number and area of the first inner electrodes 54 may vary with a capacitance value.

The first inner electrode 54 is formed to have a predetermined area, and a plurality of first extended electrodes 55a to 55f are extended from the first inner electrode 54.

In the present embodiment, the first inner electrode 54 is formed in a circular shape and the first extended electrodes 55a to 55f are formed at a certain interval along a circumference of the first inner electrode 54. The first extended electrodes 55a to 55f connect the first inner electrode 54 to first via holes (not shown) for capacitor.

Referring to FIG. 5B, a plurality of the second inner electrodes 57 are formed on the polymer sheet 51b. In the present embodiment, six second inner electrodes 57 having the same area are formed. However, the number and area of the first inner electrodes 57 may vary with a desired capacitance value.

The second inner electrode 57 and the first inner electrode 54 form a pair, and a capacitance is determined by the area of the respective inner electrodes. Accordingly, the second inner electrode 57 may be formed in a size corresponding to the first inner electrode 54.

The second inner electrode 57 is formed to have a predetermined area, and a plurality of the second extended electrodes 58a to 58f are extended from the second inner electrode 57.

In the present embodiment, the second inner electrode 57 is formed in a circular shape and the second extended electrodes 58a to 58f are formed at a certain interval along a circumference of the second inner electrode 57. The second extended electrodes 58a to 58f connect the second inner electrode 57 to second via holes for capacitor (not shown).

FIG. 5C is a top view illustrating the lamination formed of the polymer sheets 51a and 51b of FIGS. 5A and 5B.

Referring to FIG. 5C, the first inner electrode 54 and the second inner electrode 57 form a pair, interposing the polymer sheet 51a therebetween and have the same area. A capacitance occurs between the first inner electrode 54 and the second inner electrode 57 formed, interposing the polymer sheet 51a therebetween.

The first extended electrodes 55a to 55f extended from the first inner electrode 54 and the second extended electrodes 58a to 58f extended from the second inner electrode 57 are alternately separately formed at a certain interval not to overlap others.

In the present embodiment, the first inner electrode 54 and the second inner electrode 57 are formed in the shape of circle and are laminated in such a way that the first extended electrodes 55a to 55f and the second extended electrodes 58a to 58f formed around the inner electrodes 54 and 57, respectively, are alternately disposed. Also, a negative electrode is connected to the first extended electrodes 55a to 55f and a positive electrode is connected to the second extended electrodes 58a to 58f. The first extended electrodes 55a to 55f and the second extended electrodes 58a to 58f are alternately disposed as described above, thereby forming a structure where the positive electrode and the negative electrode are alternately arranged.

Since a current flows from a positive electrode to a negative electrode in a capacitor structure, in the present embodiment, a current flows from the respective second extended electrodes 58a to 58f to the respective first extended electrodes 55a to 55f and magnetic flux caused by the current is set off in the center of the inner electrodes 54 and 57. Therefore, magnetic flux is hardly generated.

In the present embodiment, a capacitor with a very small inductance value may be manufactured since inner electrodes are formed in a circular shape and a positive electrode and a negative electrode are arranged around the circle, thereby mutually setting off inductance.

In the present embodiment, an even number of extended electrodes are formed in such a way that a first extended electrode is opposite to a first extended electrode and a second extended electrode is opposite to a second extended electrode. However, when forming an odd number of extended electrodes, a first extended electrode may be disposed to be opposite to a second extended electrode.

FIGS. 6A to 6F illustrate a method of manufacturing a capacitor embedded PCB according to an exemplary embodiment of the present invention.

Figure 6A:
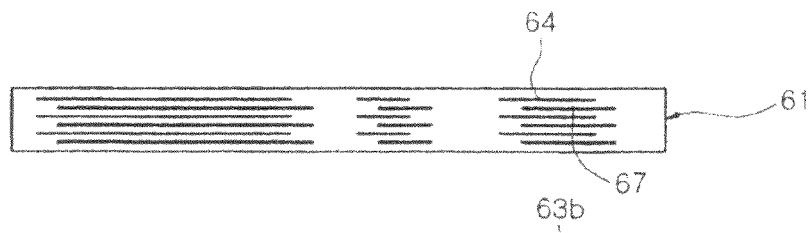
FIGS. 6A to 6F illustrate a flow of a method of manufacturing a capacitor embedded PCB, according to an exemplary embodiment of the present invention.

FIG. 6A illustrates a process of forming a polymer sheet capacitor layer by laminating a plurality of polymer sheets with electrode patterns 64 and 67 formed on one surface thereof.

Figure 6B:

In FIG. 6B, a via hole 63b is formed in a predetermined position on a copper clad laminate (CCL) board formed of a supplementary member such as FR-4 and copper foils laminated on both surfaces thereof by laser drilling or mechanical drilling and is filled by plating. After that, the both surfaces of the CCL board are coated with a dry film to be exposed to light and developed, and the copper foils are etched to form a circuit pattern 63a, thereby preparing a patterned CCL board 63.

Figure 6C:
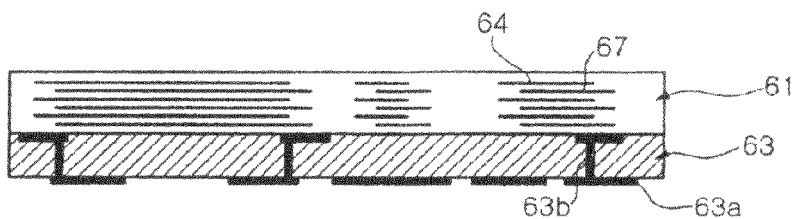

In FIG. 6C, a multilayer polymer capacitor layer 61 and the patterned CCL board 63 are laminated.

Figure 6D:
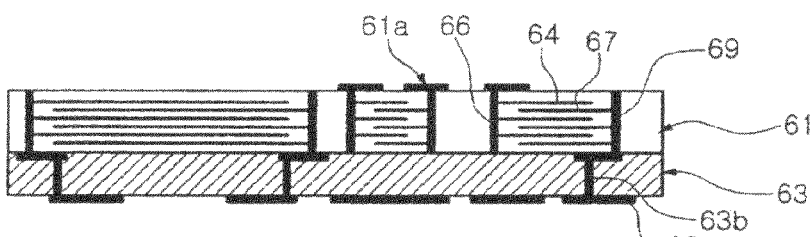

In FIG. 6D, via holes 66 and 69 for interlayer connection are formed in the multilayer polymer capacitor layer 61 and plated or filled with filler. The via holes 66 and 69 are formed to penetrate a plurality of extended electrodes connected to the inner electrodes 64 and 67. Copper foils are formed on a top of the multilayer polymer capacitor layer 61 by plating, coated with a dry film to be exposed to light and developed, and etched, thereby forming a circuit pattern 61a. The circuit pattern 61a may be formed by various methods appropriately mixing etching and plating in addition to etching.

Figure 6E:
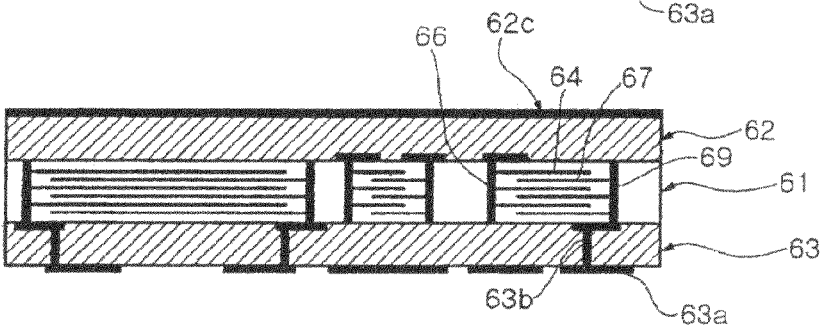

In FIG. 6E, another single-surface board 62 formed of an insulating layer and copper foils 62c is laminated on the multilayer polymer capacitor layer 61.

Figure 6F:
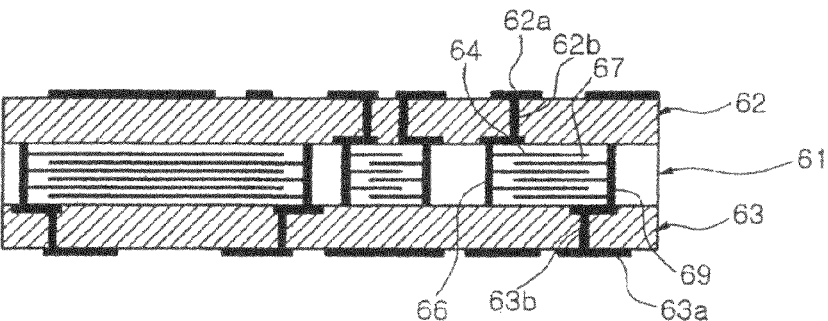

In FIG. 6F, a via hole 62b is formed in the single-surface board 62, the single-surface board 62 with the via hole 62b is coated with a dry film to be exposed to light and developed, and the copper foils are etched, thereby forming a circuit pattern 62a. As shown in FIG. 6F, the capacitor embedded PCB according to an exemplary embodiment of the present invention has a structure where multilayer high permittivity dielectric polymer sheets 61 are inserted in a PCB.

According to an exemplary embodiment of the present invention, a capacitor embedded PCB capable of setting a capacitance value according to a number of inner electrodes and laminated polymer sheets and having low inductance and high capacitance.

While the present invention has been shown and described in connection with the exemplary embodiments, it will be apparent to those skilled in the art that modifications and variations can be made without departing from the spirit and scope of the invention as defined by the appended claims.

What is claimed is:

1. A capacitor embedded printed circuit board (PCB) comprising:
    a multilayer polymer capacitor layer where a plurality of polymer sheets is laminated;
    one or more first inner electrodes and second inner electrodes, separated by one or more of the plurality of polymer sheets and alternately disposed to form a pair;
    a plurality of first extended electrodes and second extended electrodes protruding from the first inner electrodes and second inner electrodes, respectively;
    one or more insulating layers laminated on one or both surfaces of the multilayer polymer capacitor, where a plurality of conductive patterns and conductive via holes, forming an interlayer circuit, are formed;
    a plurality of first via holes for capacitor, penetrating the multilayer polymer capacitor layer to be connected to the first extended electrodes; and
    a plurality of second via holes for capacitor, penetrating the multilayer polymer capacitor layer to be connected to the second extended electrodes,
    wherein one of the plurality of the second extended electrodes is disposed to be located between the first extended electrodes that are located closest to each other and to be spaced apart at a predetermined horizontal distance from each of the first extended electrodes that are located closest to each other.

2. The PCB of claim 1, wherein the first and second inner electrodes are formed in a rectangular shape.

3. The PCB of claim 2, wherein the plurality of first extended electrodes and second extended electrodes are formed on two long sides of the first and second inner electrodes, respectively.

4. The PCB of claim 3, wherein the plurality of first extended electrodes and second extended electrodes formed on the same long side surface have the same interval.

5. A capacitor embedded printed circuit board (PCB) comprising:
    a multilayer polymer capacitor layer where a plurality of polymer sheets is laminated;
    one or more first inner electrodes and second inner electrodes, separated by one or more of the plurality of polymer sheets and alternately disposed to form a pair;
    a plurality of first extended electrodes and second extended electrodes protruding from the first inner electrodes and second inner electrodes, respectively;
    one or more insulating layers laminated on one or both surfaces of the multilayer polymer capacitor, where a plurality of conductive patterns and conductive via holes, forming an interlayer circuit, are formed;
    a plurality of first via holes for capacitor, penetrating the multilayer polymer capacitor layer to be connected to the first extended electrodes; and
    a plurality of second via holes for capacitor, penetrating the multilayer polymer capacitor layer to be connected to the second extended electrodes,
    wherein the first and second inner electrodes are formed in a circular shape, and
    one of the plurality of the second extended electrodes is disposed to be located between the first extended electrodes that are located closest to each other and to be spaced apart at a predetermined horizontal distance from each of the first extended electrodes that are located closest to each other.

6. The PCB of claim 5, wherein the plurality of first extended electrodes and second extended electrodes adjacent to each other are formed to have the same interval.

7. The PCB of claim 6, wherein numbers of the plurality of the first and second extended electrodes are even numbers, respectively.

8. The PCB of claim 1 or 5, wherein the first extended electrodes of each of the first inner electrodes do not overlap with second extended electrodes of a second inner electrode adjacent the each of the first inner electrodes.

9. The PCB of claim 1 or 5, wherein at least one of the first extended electrodes of one of the first inner electrodes are located on a same long side with second extended electrodes of a second inner electrode adjacent the one of the first inner electrodes.

* * * * *